(12) United States Patent
Zeighami et al.

(10) Patent No.: US 9,007,221 B2
(45) Date of Patent: Apr. 14, 2015

(54) LIQUID COOLING OF RACK-MOUNTED ELECTRONIC EQUIPMENT

(71) Applicant: Cisco Technology, Inc., San Jose, CA (US)

(72) Inventors: Roy Zeighami, San Jose, CA (US); James Leach, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 55 days.

(21) Appl. No.: 13/968,792

(22) Filed: Aug. 16, 2013

(65) Prior Publication Data

US 2015/0048950 A1   Feb. 19, 2015

(51) Int. Cl.
G08B 21/00 (2006.01)
H05K 7/20 (2006.01)
G01F 23/00 (2006.01)
G08B 21/20 (2006.01)
G06F 1/20 (2006.01)
H01L 23/473 (2006.01)

(52) U.S. Cl.
CPC ........ *H05K 7/20781* (2013.01); *G01F 23/0061* (2013.01); *G08B 21/20* (2013.01); *G06F 1/206* (2013.01); *H01L 23/473* (2013.01)

(58) Field of Classification Search
CPC .......... G06F 1/20; G06F 1/206; H01L 23/473
USPC ............ 340/605; 165/80.4, 104.33; 361/696, 361/699
See application file for complete search history.

(56) References Cited

U.S. PATENT DOCUMENTS

| | | | | |
|---|---|---|---|---|
| 6,924,981 | B2 * | 8/2005 | Chu et al. ................. | 165/104.33 |
| 7,957,144 | B2 * | 6/2011 | Goettert et al. ............. | 361/699 |
| 7,961,465 | B2 * | 6/2011 | Goldrian et al. ............. | 361/699 |
| 8,089,764 | B2 * | 1/2012 | Attlesey ...................... | 165/80.4 |
| 8,274,792 | B2 * | 9/2012 | Soffer .......................... | 361/700 |
| 8,467,189 | B2 * | 6/2013 | Attlesey ...................... | 361/699 |
| 2006/0067052 | A1 * | 3/2006 | Llapitan et al. .............. | 361/700 |
| 2014/0124168 | A1 * | 5/2014 | Dean et al. ..................... | 165/67 |

* cited by examiner

*Primary Examiner* — John A Tweel, Jr.

(57) ABSTRACT

A server rack holds a number of modular servers configured for liquid cooling by passing a liquid coolant through interiors of the servers. Failure management of the cooling system is by management of the servers in segregated fault domains. Each fault domain comprises a number of the servers serviced by a dedicated coolant circuit that is segregated from the cooling circuits of the other fault domains. Potential liquid coolant leaks in a specific fault domain can be identified by monitoring liquid coolant levels in the respective coolant circuits. Each fault domain can include a separate, dedicated heat exchanger and a separate, dedicated coolant reservoir.

20 Claims, 6 Drawing Sheets

US 9,007,221 B2

LIQUID COOLING OF RACK-MOUNTED ELECTRONIC EQUIPMENT

TECHNICAL FIELD

This disclosure relates generally to electronic equipment and more particularly to methods, systems, and assemblies for cooling electronic equipment held in rack-mounted assemblies, for example in data center facilities. The disclosure further relates, inter alia, to cooling assemblies for electronic equipment racks, to electronic equipment rack assemblies, to cooling systems for data centers, and to data center facilities.

BACKGROUND

Multiple electronic equipment units are often housed in high-density assemblies, such as server racks, in which modular electronic equipment units (e.g., servers) are mounted on an upright frame or rack in a vertically spaced, stacked arrangement. Large numbers of such server racks, for example, may in turn be housed together in a high-density electronic equipment facility or data center.

Electronic equipment generates heat, typically requiring cooling to prevent overheating. The importance of heat management is amplified when electronic equipment is located in concentrated density, for example, server racks and data centers. Data center cooling systems often include air cooling of individual modular components (e.g., rack servers), for example by circulating air through the casings of respective rack-mounted servers. Such air cooling, however, can lead to inefficient data center architecture and may expose internal components of the servers to outside contamination in instances where ambient air is used.

Alternatively, or in combination with air cooling, heat rejection of rack-mounted server components can be achieved by direct liquid cooling, for example by circulating a liquid coolant along sealed conduits that pass through the server casings in heat exchange relationship with server components. A complication of direct liquid cooling is that it necessarily brings liquid coolant into close proximity with liquid-intolerant electronic components, and is thus perceived as exposing the server rack and/or data center to substantial leakage failure risks.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which.

DETAILED DESCRIPTION

The following description and the drawings sufficiently illustrate specific embodiments to enable those skilled in the art to practice and/or implement the disclosed systems, methods, and/or apparatuses. Other embodiments may incorporate structural, operational, and other changes. Portions and features of some embodiments may be included in, or substituted for, those of other embodiments.

Figure 1:
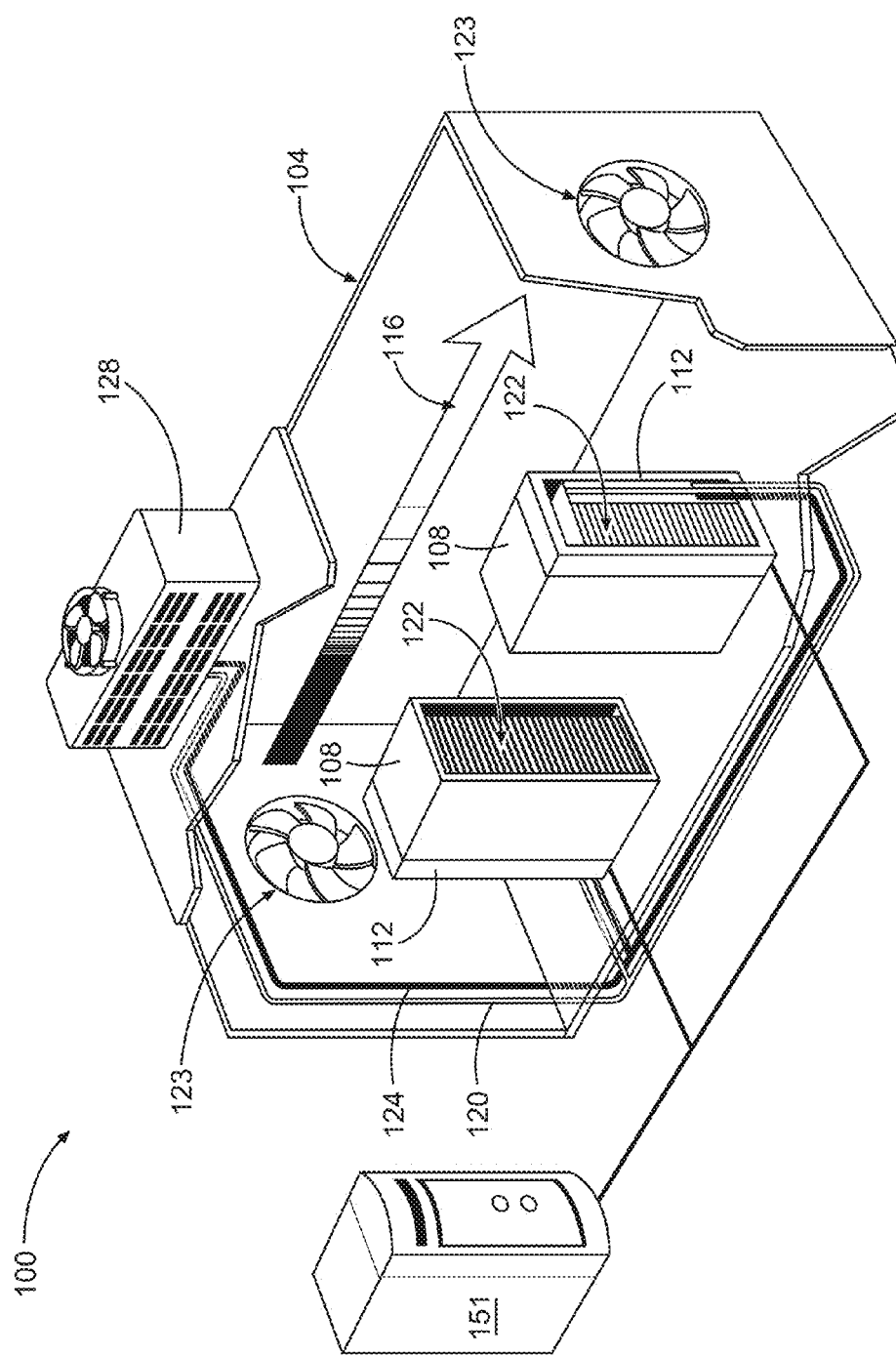
FIG. 1 is a schematic, cut-away three-dimensional front view of a data center facility that includes a liquid cooling system in accordance with an example embodiment.

In FIG. 1, numeral 100 generally indicates a data center 100 in accordance with an example embodiment. In this disclosure, the term "data center" refers not only to facilities that provide high-capacity data storage nodes, but also includes high-density electronic equipment facilities employed for other purposes. The data center 100 comprises a server room 104 in which electronic equipment units are rack-mounted, being held in numerous concentrated, high-density equipment rack assemblies, in this example comprising servers 122 (in this example, C220 M3 servers) housed in server racks 108. For clarity of illustration, FIG. 1 shows only two server racks 108, but the data center 100 will in practice comprise a significantly greater number of server racks 108. The arrangement of the server racks 108 shown in FIG. 1 is thus simplified for the purpose of illustration, and can in practice be varied for cooling efficiency. Some embodiments may comprise, e.g., a hot/cold aisle pattern for hybrid cooled servers.

The servers 122 are held in the respective server racks 108 in a standard vertically stacked arrangement in which the servers 122 form an upright interspaced column. The servers 122 in a particular server rack 108 are thus substantially in vertical alignment, with a vertical gap between vertically adjacent servers 122. Each server 122 is horizontally slidable on rails mounted to an equipment support frame of the associated server rack 108.

The example data center 100 employs a combination of air cooling and direct liquid cooling. The data center 100 may thus include a ventilation system comprising impellers or fans 123 to move air (in this example ambient air 116) through the server room 104. In other example embodiments, air conditioning may be used instead of circulating ambient air 116 through the server room 104. Yet further embodiments may make use of liquid cooling exclusively (see, e.g., FIG. 5), in which case the air cooling system is omitted.

The example data center 100 further comprises a liquid cooling system in which liquid coolant is pumped to the server racks 108 via a facility coolant supply line 124, with warmer coolant being returned via a facility coolant return line 120 after direct or (as in this example) indirect heat exchange with internal components of the servers 122. The facility coolant supply line 124 and the facility coolant return line 120 form part of a facility cooling loop 217 (see also FIG. 2) that removes heat from the server room 104 but, in this example, does not pass through the respective servers 122 (as will be described with reference to FIG. 2). While the liquid coolant in the facility coolant circuit may in other examples be a water-based coolant mixture, the facility liquid coolant in this example comprises untreated water cooled to the dry bulb temperature of the outside air.

In this example embodiment, each server rack 108 comprises an equipment rack assembly that includes a Cooling Distribution Unit (CDU) extension 112 attached to an equipment support frame 202 (see FIG. 2) of the server rack 108, to form a server rack assembly. As can be seen in FIG. 1, the CDU extension 112 comprises a generally rectangular rack extension body or frame having a profile similar to the frame 202 of the server rack 108, when seen in end view. The CDU extension 112 is aligned with the corresponding server rack 108 and it is attached in end-to-end abutment with the server rack 108 at its rear. Each CDU extension 112 may provide a pair of connectors for the coolant return line 120 and the coolant supply line 124 respectively.

As will be described in greater detail with reference to FIG. 2, the CDU extension 112 provides an integral manifold arrangement for circulating facility coolant liquid through a plurality of heat exchangers 205 (FIG. 2), and for providing a liquid-flow connection between the respective heat exchangers 205 and associated servers 122, to circulate coolant through each server 122 individually. As mentioned, facility coolant provided by the coolant supply line 124 is in this example kept separate by the CDU extension 112 from liquid coolant circulated through the servers 122. The CDU extension 112 therefore instead provides a heat exchange interface between a closed equipment-side cooling circuit in the example form of a server loop 219 circulating server coolant (see FIG. 2), and the facility loop 217. The facility coolant of the facility loop 217 therefore provides a heat disposal medium to which heat is transferred from the respective server loops 219 by the plurality of heat exchangers 205. In this example, the liquid coolant in the server loops 219 is a glycol/water mixture, but other liquids can be used as coolant medium in other embodiments.

The example CDU extension 112 has a plurality of heat exchangers 205, each of which connects the facility coolant supply line 124 and the facility coolant return line 120, to close the facility loop 217, and also connects a server coolant supply line 204 to a server coolant return line 206, to close the particular server loop 219 for a plurality of servers 122 in a common fault domain 203. The server coolant supply line 204 and the server coolant return line 206 provide a liquid-flow connection between the coupled heat exchanger 205 and a subset of the rack's servers 122 that are members of the same fault domain 203. At least part of this liquid flow connection may be provided by an integral manifold arrangement on the CDU extension 112, comprising separate manifold connections for each of heat exchangers 205.

As will be described below in greater depth, the CDU extension 112 thereby provides a plurality of separate fault domains 203 for each server rack 108, to facilitate management of data center liquid cooling by promoting slow leak detection and limiting catastrophic leak damage. Each fault domain 203 thus has a respective equipment-side cooling circuit (e.g., server loop 219) passing through a respective, exclusive subset of the servers 122 (e.g., passing through the servers 122 in a common fault domain 203), with the equipment-side cooling circuits of respective fault domains 203 being in liquid flow segregation from one another, so that no transfer or sharing of liquid coolant between equipment-side cooling circuits is possible. With an "exclusive subset" of a fault domain 203 or a heat exchanger 205 is meant that there is no overlap between the servers 122 in different fault domains 203, and that each equipment side coolant circuit serves only those servers 122 in a particular associated fault domain 203, and no others.

Returning for the moment to FIG. 1, it will be seen that the example data center 100 provides for cooling of coolant in the facility loop 217 by heat exchange with ambient air, in this example, at a radiator 128. Note that the cooling system of the example data center 100 occurs without refrigeration, thereby providing a so-called "economizer" solution. A number of alternative methods may be employed to cool the facility coolant. Data center heat rejection typically incurs high capital expense and operating costs. Use of economizer solutions may further be incentivized by national, state, or federal regulations. Air-side economizers use outside air directly, while water-side economizers may use water directly from a cooling tower, evaporative cooler, or dry cooler.

A benefit of water-side economizers is that direct liquid cooling of servers may be achieved using relatively warm, unrefrigerated water. For example, liquid cooled servers can reject their heat to water that is of a temperature high enough (e.g., about 45° C.) to allow the production thereof in almost any geography using a dry cooler. Direct warm water cooling thus potentially enables year-round operation using only a dry-cooler, without refrigeration. In this example embodiment, a water-side economizer in the example form of radiator 128 is used.

A further benefit of water-side economizers with direct liquid cooling is that they isolate electronic hardware from outside contamination, because (unlike air-side economizers) airborne contaminants are not brought into contact with the electronics. This isolation eliminates the need to install chiller capacity to be able to fully handle 100% of the outside load in the event of a contamination event (e.g., a forest fire, a chemical spill, or the like), reducing capital cost.

Direct liquid cooling, however, is often viewed as being a riskier solution than air-cooling systems, because of real or perceived risk in exposing the electronic equipment to liquid coolant in the event of cooling system failures. The server racks 108 of the example data center 100 employ methods and systems to promote early fault detection and fault damage containment. In the embodiment described with reference to FIGS. 1-3, example mechanisms for fault detection and damage containment are integrated in the CDU extension 112, permitting retrofitting of standard server racks 108. In other embodiments, however, similar or analogous mechanisms may be natively incorporated by an original equipment manufacturer in a server rack, or may otherwise be provided in association with a server rack without forming part of a rack attachment such as the CDU extension 112. Interior cooling of the electronic equipment may in some embodiments be achieved by use of dielectric fluids to which the electronic components can safely be exposed directly. While dielectric coolants are a lesser leakage risk than water-based coolant, these benefits are mitigated by thermal performance of the dielectric fluids, which are such that the fluid would often need cooling to sub-ambient temperatures.

Returning now to FIG. 2, it can be seen that the example CDU extension 112 is configured to compartmentalize the server rack 108 into the plurality of fault domains 203 to limit or quarantine failure damage or failure consequence within a particular fault domain 203. The fault domains 203 may be vertically separated, so that each fault domain 203 comprises a subset of a column of servers 122 in the server rack 108, in this example comprising a subgroup of seven vertically adjacent modular servers 122.

Failure separation of the respective fault domains 203 is achieved, at least in part, by providing a separate server loop 219 for each fault domain 203. The server loop 219 of each fault domain 203 includes a separate, dedicated heat exchanger 205. The CDU extension 112 therefore has a plurality of heat exchangers 205, one for each fault domain 203. Note that provision of a common, isolated server loop 219 for the servers 122 of each fault domain 203 means that there is a closed equipment-side coolant circuit for each fault domain 203, thus limiting the maximum volume of liquid coolant that can possibly be released by a single leak to the volume of the closed server loop 219 of one of the fault domains 203.

The CDU extension 112 may further comprise a plurality of makeup tanks 207, one for each fault domain 203. The respective makeup tanks 207 are connected to respectively associated server loops 219, being in fluid flow connection with, e.g., the server coolant supply line 204. Each makeup tank 207 is dedicated to the associated fault domain 203, being connected exclusively to the server loop 219 of that fault domain 203. Each makeup tank 207 serves as a coolant reservoir to automatically provide supplemental liquid coolant to the associated server loop 219, in operation, ensuring that fluid conduits of the server loop 219 are constantly filled. Note that in practice, some loss of coolant from the respective server loops 219 is inevitable. Such loss of coolant may occur, for example, when a server 122 is connected to or disconnected from the associated server loop 219 during mounting or dismounting of the server 122 on the server rack 108. Even though CDU connectors 305 (see FIG. 3A) mounted on the server 122 for connection to the server coolant supply line 204 and a server coolant return line 206 are effectively dripless connectors, some liquid coolant (but usually not enough for drop formation) is typically still lost during connection or disconnection. The makeup tank 207 automatically compensates for such coolant loss by automatically supplementing the liquid coolant in the server loop 219.

A method of cooling the example data center 100 may include monitoring the separate liquid volumes of each of the server loops 219, with the makeup tanks 207 for these purposes being considered part of the respective server loops 219. To this end, a sensor arrangement may provide separate coolant volume measurements for each makeup tank 207, each makeup tank 207 in this example having a dedicated level sensor 211 to measure the level of liquid coolant in the makeup tank 207, and/or to measure a rate of change of makeup tank coolant level. In some example embodiments, the level sensors 211 may be connected to telemetry equipment, or may be electrically connected to a control system 151 (see FIG. 1), to automatically generate an alarm signal if the coolant level therein drops below a threshold value, and/or if the rate of change of the coolant level in the makeup tank 207 exceeds a predefined threshold rate of change. The makeup tank-level sensor combination promotes early detection of slow leaks in the associated fault domain 203, and enables pinpointing a catastrophic leak to a particular fault domain 203.

Figure 3A:
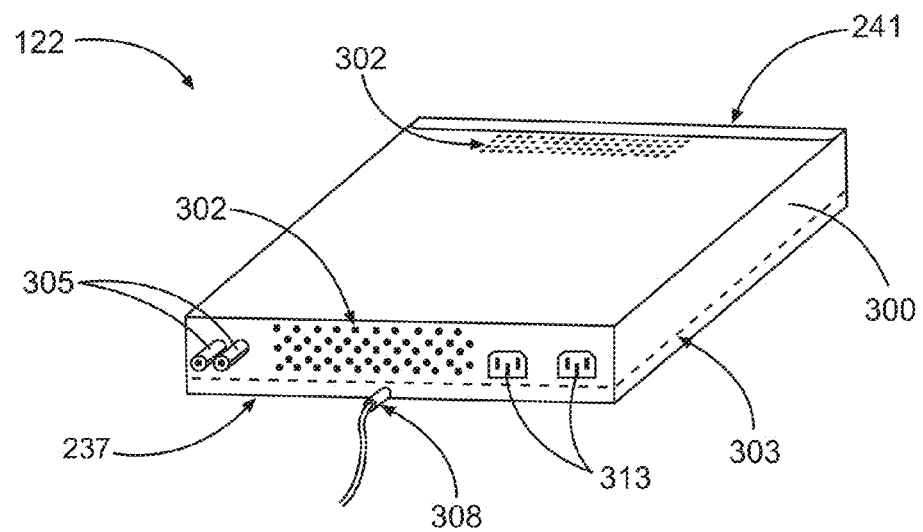
FIGS. 3A and 3B are schematic three dimensional views of respective modular servers, in accordance with respective example embodiments, the example server of FIG. 3A being configured for use in a server rack assembly such as that shown in the example embodiment of FIG. 2.

FIG. 3A shows an example embodiment of a server 122 configured for mounting in the example server rack 108. The server 122 has a rectangular parallelepipedal casing 300 in which electronic components are housed. The server 122 in this example is designed for combined liquid- and air cooling, and is accordingly provided both with the CDU connectors 305 and with air vents 302 in a top panel and a rear panel 237 of the casing 300. The CDU connectors 305 project rearwards from the rear panel 237 for connection to the server coolant supply line 204 and the server coolant return line 206. The CDU connectors 305 place the heat exchanger 205 in fluid flow communication with an internal cooling circuit comprising conduits that route liquid coolant through the interior of the casing 300. The internal cooling circuit may include pumps and/or cold plate units positioned in close proximity with server components that are of particular concern with respect to heat management. Internal cooling pumps and/or cold plates may thus be placed atop components such as central processing units (CPUs), graphics processing units (GPUs), or memory units. In this embodiment, the CPUs and memory are water-cooled, with the balance of the hardware being air-cooled.

The casing 300 has a liquid-sealed base 303, which effectively provides an integrated leak pan serving as a primary leak container. The sealed base 303 is provided, in this example, by a coolant-impervious lining applied to a bottom panel of the casing 300, and extending partway up the respective casing sidewalls. The effective height of the sealed base 303 is indicated in FIG. 3A by the dashed lines extending along the visible side panel and the rear panel 237. A horizontally extending top edge of the base 303 is, in this example, lower than the lowermost air vents 302 in the rear panel 237. In the event of leaking occurring within the casing 300, the sealed base 303 can collect at least some leaked coolant. In this instance, the sealed base 303 is sized to be only somewhat larger in volume than the maximum volume of coolant in one of the server loops 219 (including the associated makeup tank 207), facilitating complete containment within the server casing 300 of coolant issuing from a server loop leak in the server 122.

The server 122 further has a drainage mechanism in the example form of a spout or drain hole 308 in the rear panel 237 of the casing 300, leading out of the sealed base 303. The drain hole 308 is connected by a short drain tube to a vertically extending drip line 223 (see, e.g., FIG. 2) that is common to all the servers 122, across the respective fault domains 203. Referring now to FIG. 2, it will be seen that the drip line 223 drains to a secondary leak container provided by a universal leak sump in the example form of a common drip pan 247 located at the bottom of the server rack 108.

Further leak containment, as well as granular leak contagion isolation, may be provided by a leakage catchment container in the example form a leak pan 213 at the lowermost paragraph of each fault domain 203. Each leak pan 213 extends horizontally, spanning a horizontal width and a horizontal depth of the column of servers 122, so that the subgroup of servers 122 that are members of a respective fault domain 203 are located between two vertically adjacent leak pans 213.

Each leak pan 213 is, in turn, configured to drain to the common drip pan 247, via respective vertically extending drain lines 243. In some embodiments, the drip line 223 may be configured to drain leakage from the servers 122 in each fault domain 203 to the associated leak pan 213. In this example embodiment, however, the drip line 223 drains directly to the drip pan 247, with the leak pans 213 serving to catch any overflow which could not be evacuated by the drip line 223, and/or to catch and contain any coolant issued from a leak outside one of the servers 122. The drip pan 247 may be sized such that it is able to accommodate the maximum volume of liquid coolant that can be contained in the server loop 219 (including the associated makeup tank 207) of a single fault domain 203.

A front panel 241 of each server 122 provides various access ports, networking connections, and power connectors. The server rack assembly in this example includes a power distribution unit (PDU) 229 that provides PDU plugs or sockets 231 for respective servers 122. The PDU sockets 231 are remotely controllable by the facility control system 151, with the respective PDU sockets 231 being mapped to associated servers 122. In this particular example, the PDU sockets 231 of each domain are mapped to a common set of matched PDU sockets 231. The PDU sockets 231 of each fault domain 203 are collectively switchable separately from the PDU sockets 231 of other fault domains 203. This permits substantially immediate cutting of power to all of the servers 122 within a fault domain 203 in which a catastrophic leak, for example, is detected. As will be seen with reference to description of the embodiment of FIG. 3B, front access is particularly beneficial for fully sealed servers, as they can be placed back-to-back without room for exhaust.

Figure 2:
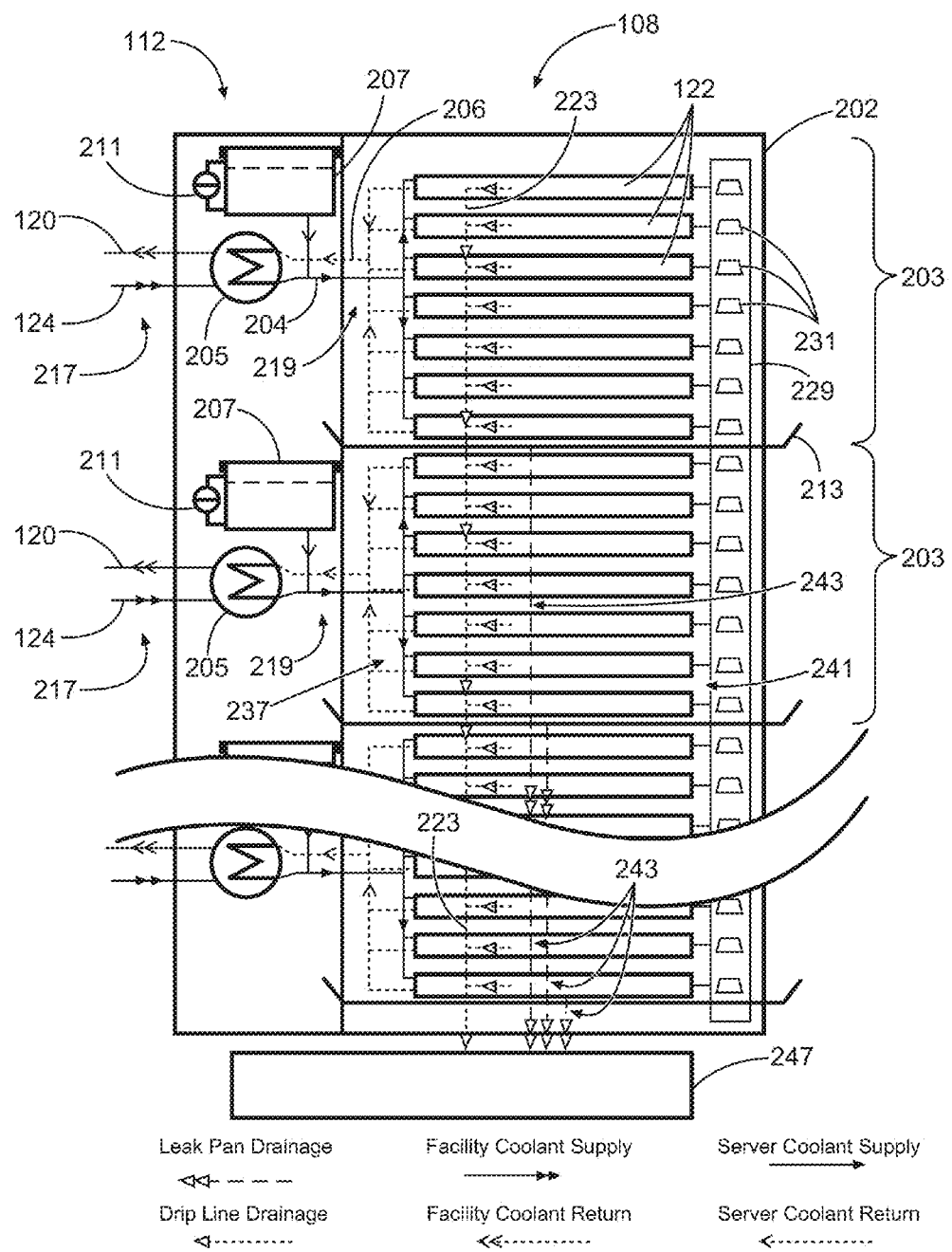
FIG. 2 is a schematic side view of an example server rack assembly to provide for risk-managed liquid cooling of rack-mounted electronic equipment, in accordance with an example embodiment.

For clarity of illustration, only two of the fault domains 203 of the server rack 108 are shown in FIG. 2, but note that the server rack 108 has a greater number of fault domains 203. In the present example embodiment, for example, the server rack 108 is configured for holding a 42-unit high stack of servers 122, so that six separate fault domains 203 are provided. The rack assembly comprising the server rack 108 and the CDU extension 112 may thus include six heat exchangers 205, six makeup tanks 207, six separate server loops 219, six leak pans 213, and six drain lines 243. The particular number of managed fault domains 203 per server rack 108 can be varied in different embodiments, depending on design considerations and a desired balance between cost and risk mitigation.

In operation, the liquid cooling system provided by the server rack 108 and the CDU extension 112 provides efficiency and effectiveness benefits associated with direct liquid cooling, while ameliorating leakage failure risk exposure. A dual approach to fault identification and damage containment or limitation is provided by differentiating between slow and fast leaks, each of these being separately identifiable by failure management components of the example system. Remedial action in response to identifying a fault may also be different for fast leaks and for slow leaks.

In the event of a slow leak occurring within one of the servers 122, leaked coolant is temporarily contained by the primary leak container provided by the sealed base 303 of the casing 300, from where the leaked coolant is drained to the common drip pan 247 via the drip line 223. Exposure of any other server 122 to such slowly leaked coolant is thus effectively prevented. If slow leakage were to occur externally to one of the servers 122, the leaked coolant is cached by the subjacent leak pan 213.

Slow leaks are detected by monitoring coolant levels in the respective makeup tanks 207, as measured by the associated level sensor 211. It will be appreciated that ordinary, unexceptional coolant loss from each of the server loops 219 can be expected to fall within an established acceptable range. Coolant loss at a rate greater than the upper limits of this established range may indicate a leakage event or fault in the associated server loop 219. In this example embodiment, the level sensors 211 are monitored by a computer-implemented monitoring module forming part of the control system 151, the monitoring module being configured to raise a slow-leak alert when a rate of change of liquid level in any one of the makeup tanks 207 rises above a predefined threshold. Instead, or in addition, measurement instrumentation may be coupled to the leak pans 213 and/or the drip pan 247, for example to sense the presence of moisture or moisture content levels in the leak pans 213 and/or the drip pan 247. Leakage may also be identified by visual inspection of the leak pans 213 and/or the drip pan 247.

Remedial action in response to identification of a slow leak may comprise inspection of the server rack 108 by maintenance personnel, to identify the origin of the detected slow leak. Such leak identification is facilitated by segregation of the equipment-side cooling circuits into the server loops 219 of the respective fault domains 203. In cases where the original detection of the presence of the leak is through level sensing of the makeup tanks 207 (or through identification of leaked coolant in one of the leak pans 213), a particular fault domain 203 in which the leak occurs is pinpointed in the process of detecting the presence of the leak. In some embodiments, the system may include moisture detectors or moisture sensing arrangements associated with respective drip lines 223, to pinpoint a slow leak.

Because each makeup tank 207 and heat exchanger 205 services only the subset of servers 122 in the associated fault domain 203, a slow leak identified by exceptional rates of level change in the makeup tanks 207 necessarily occurs in the associated server loop 219. Visual inspection of individual servers, to identify the particular server 122 exposed to the server loop 219, can thus be limited to the servers 122 in the identified problematic fault domain 203. A monitoring system forming part of the example control system 151 may therefore be configured (e.g., by program software) to pinpoint the particular fault domain 203 in which the detected fault has occurred, and may be programmed to automatically suggest a service schedule to replace potentially faulty servers 122.

Note that the configuration of the liquid cooling system on the server rack 108 into quarantined fault domains 203 not only reduces the number of servers 122 that are to be inspected responsive to leak detection (in this example embodiment by a factor of six), compared to existing servers with a single makeup tank common to all the servers in the rack, but the multiple makeup tanks 207 and associated level sensors 211 constitute more finely calibrated leak-detection instrumentation. Because the volume of coolant in one of the multiple server loops 219 is smaller than the volume of coolant in a server loop common to all the servers (in this example embodiment being six times smaller) a leak of comparable volume comprises a larger fraction of coolant in the associated closed circuit for one of the multiple makeup tanks 207 than is the case for existing, universal makeup tanks.

In the event of a fast or catastrophic leak, leak damage is limited, on the one hand, by inherent restriction of the maximum volume of liquid coolant available for leakage, and, on the other hand, by slowing and containing propagation of leaked coolant to operation of the described leak risk management architecture.

It is emphasized that the facility loop 217 and the respective server loops 219 are separate and do not mix. Each fault domain 203 thus has a limited amount of coolant, comprising supplemental coolant in the makeup tank 207 and coolant currently circulating in in the server loop 219 between the associated heat exchanger 205 and the subset of servers 122. There is no possibility of supplementation of coolant liquid in the server loop 219 by, for example, water circulating in the facility loop 217. Even in the event of extreme failure, such as rupture of a conduit of the internal cooling circuit in one of the servers 122, for example, the volume of liquid released into the server rack 108 can be no more than the volume of the server loop 219 (including the makeup tank 207). Consider, for example, that server-side leaks of liquid coolant in comparable existing server racks can cause up to seven liters of coolant to drain out of the equipment-side cooling loop and into the interior of the server rack. In contrast, the volume of coolant in each of the fault domains 203 of the example server rack 108 can be between 0.6 and 1.5 liters.

Multiple leak catchment levels are provided by the described server rack 108, to contain and limit leakage. First, propagation of leaked coolant is at least slowed by the sealed casing base 303 which collects leaked coolant in the bottom of the respective server 122 and is evacuated by the drip line 223 to the common drip pan 247. Most leakage faults may, in practice, be contained by such server-level catchment and evacuation to the common drip pan 247.

In cases where coolant leaks into one of the servers 122 at a rate greater than that at which it can be evacuated from the server 122 through the drain hole 308 to the drip line 223 (or if the drainage mechanism is for some reason occluded), liquid leaked into the interior of the server 122 may spill out of the casing 300 into the interior volume of the server rack 108. Coolant may likewise be released into the interior of the server rack 108 when a leak fault originates outside of one of the servers 122, for example at a CDU connector 305. Leak damage that can be caused by such environmental leakage is contained or restricted by catchment of the released coolant in the leak pan 213 of the fault domain 203 in which the leak occurred. Note again that each leak pan 213 spans both the width and the depth of the rack frame 202, effectively sectioning of the server rack 108 into vertically watertight compartments corresponding to the respective fault domains 203.

The leak pans 213 may be sized to have a containment volume greater than the volume of liquid coolant in one of the server loops 219, to reduce (if not eliminate) the likelihood of leak pan overflow. Contagion of leak damage beyond the affected fault domain 203 is further restricted by drainage of the leak pan 213 to the common drip pan 247, via the corresponding drain line 243. Because of the described leak containment mechanisms, the maximum extent of leak damage resulting from a single leakage fault in the server rack 108 is limited to the equipment and servers 122 in a single one of the fault domains 203, therefore preventing even a catastrophic failure from becoming contagious, spreading extensively throughout the server rack 108 or the data center 100.

The control system 151 may further be configured to automatically sever supply of AC power to the servers 122 in the affected fault domain 203 in response to detection of a fast leak in that fault domain 203. A high priority fault alert may additionally be issued in such instances. The provision of the PDU 229 with plug-level AC power control and mapping information that maps each server 122 to a corresponding fault domain 203 enables an operator, or the control system 151, to sever AC power to all servers 122 in a fault domain 203 with a catastrophic failure.

It is a benefit of the liquid cooling system provided by the example CDU extension 112 that it operates with significantly reduced leak failure risk than existing data center liquid cooling systems, facilitating the use of relatively cost-effective liquid cooling systems to meet cost- and regulatory challenges associated with economizer solutions. A further benefit is that it reduces damage risk for both catastrophic failures (in which a fast leak leads to its hardware being exposed to actual condensed liquid, potentially resulting in immediate failure of affected electronic devices because of short-circuits), and slow leaks (in which the leak is so slow that no condensed liquid comes into contact with electronic hardware, but may lead to equipment overheating because of coolant depletion in a closed coolant circuit).

The fault detection mechanisms disclosed by the described example embodiments beneficially permit or facilitate early distinction between slow and fast leaks, at the detection stage. This permits maintenance personnel to respond to fault detection more effectively, by employing different response protocols for fast leaks and slow leaks respectively. Slow leaks may, for example, be given a lower priority, to be dealt with on a non-urgent basis or during regularly scheduled maintenance. Fast leaks, on the other hand, may be dealt with urgently, being given priority status.

Figure 3B:
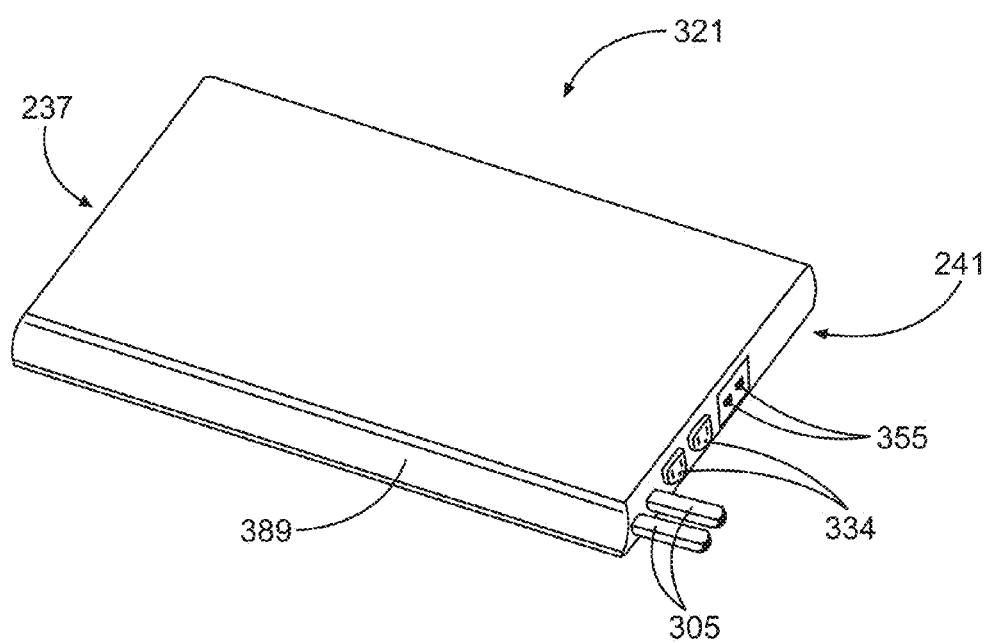

FIG. 3B shows a modular electronic equipment unit in accordance with another example embodiment. The electronic equipment unit is in the example form of a modular server unit 321 (e.g., a server, a storage module, a networking module, or the like) configured for substantially airtight liquid cooling, permitting the use of a fully sealed casing to fully contain internal leaks and prevent failure contagion. The example sealed server unit 321 further facilitates the provision of effectively single-side access electronic equipment facilities such as example mobile modular data center facilities that will be described below with reference to FIGS. 4-5.

The modular server unit 321 of FIG. 3B is configured for operative cooling by direct liquid cooling, without moving ambient air therethrough. The modular server unit 321 accordingly has a casing 389 having no air vents or fans. In this example, the casing 389 is hermetically sealed, having cooling system connectors 305 provided on its front panel 241 for connection to a supply of liquid coolant. Cooling of the internal components of the modular server unit 321 may therefore be similar or analogous to that described above for the example server rack 108 of FIG. 2, except that the modular server unit 321 does not provide for air cooling of its components by moving ambient air through it. In some embodiments, high-power devices like CPUs and memory are provided with cooled heatsinks (e.g., cold plates), while remaining parts within the casing 389 can be cooled by air circulated internally through a liquid-to-air heat exchanger.

Because the placement of internal components of the modular server unit 321 is not constrained by airflow limitations/considerations, internal components (e.g., hard disk drives (HDDs), CPUs, memory, power supply components, and the like) may be placed for maximum density. It is, for example, not necessary to front-located HDDs, and these may be placed elsewhere in the interior of the casing 389. The modular server unit 321 is designed for cooling even with relatively warm liquid coolant, for example being operable with water at a temperature of about 45° C.

The modular server unit 321 is further constructed for single-side access, with all connection interfaces and instrumentation being provided on a single side of the server casing 389, in this case being presented on the front panel 241 of the modular server unit 321. As can be seen in FIG. 3B, the front panel 241 in this example provides the cooling system connectors 305, the plurality of power sockets 334, and networking connections 355 for the modular server unit 321. The front panel 241 thus consolidates a cooling interface, a power supply interface, and a communications interface. The rear panel 237 of the server casing 389 is, in this example, completely blank and provides no interface components. The rear of the modular server unit 321 therefore does not need to be accessed when the modular server unit 321 is in use.

Figure 4A:
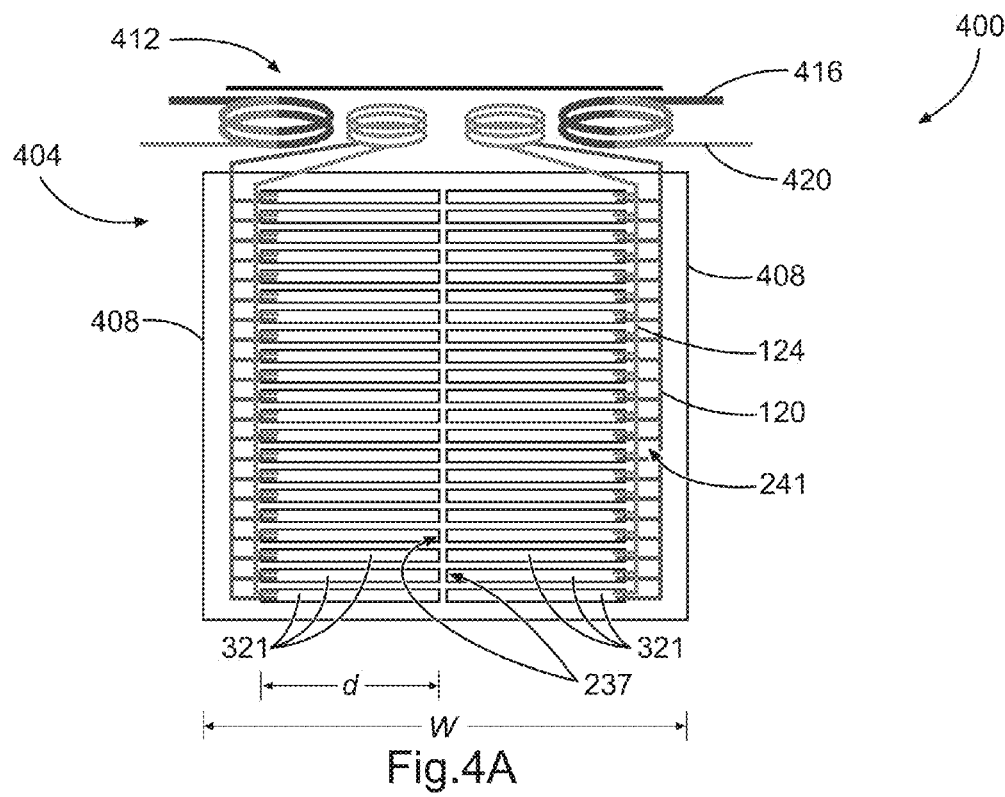
FIGS. 4A and 4B are schematic end views of respective mobile modular data center facilities, in accordance with respective example embodiments, the data center facilities including rack-mounted servers configured in accordance with the example embodiment shown in FIG. 3B.
Figure 4B:
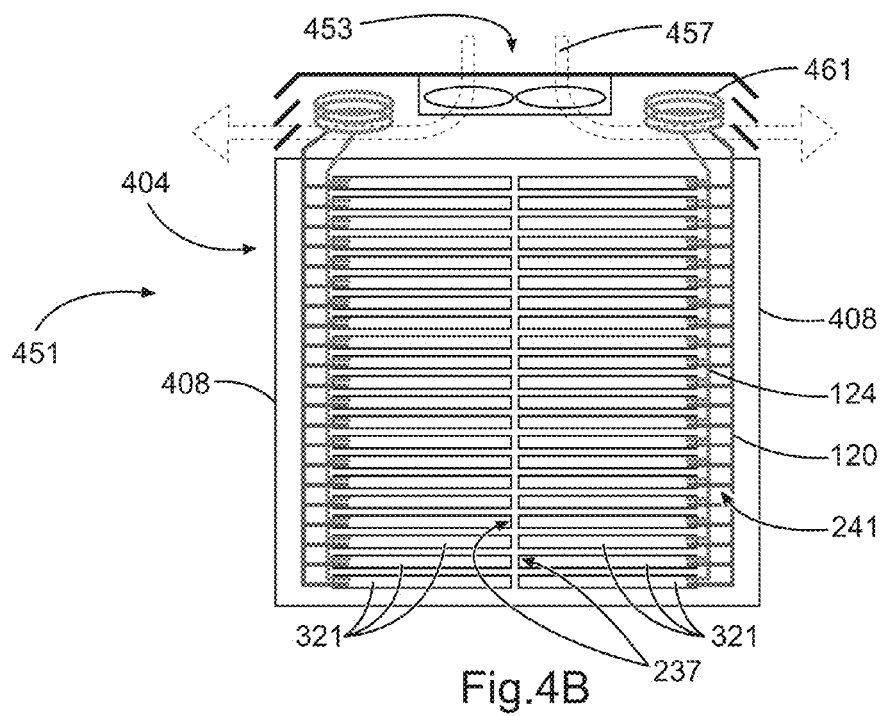

Consolidation of the various interfaces on a single side of the modular server unit 321 facilitates ultradense collocation of a multiplicity of the modular server units 321 in a data center-type setup. FIGS. 4A and 4B illustrate two example embodiments in which the example modular server unit 321 can be employed to promote server density in an electronic equipment facility.

FIG. 4A shows a modular data center 400 having a standard shipping container form factor, facilitating mobility of the data center 400 by compatibility with standardized transportation equipment. The container data center 400 therefore comprises a standard-shaped rectangular cuboid container 404 in which a multiplicity of the modular server units 321 is housed. The modular server units 321 are arranged and oriented in the container 404 for side-access, with a front panel 241 of each server unit 321 facing laterally outwards and being accessible through side doors 505 (see FIG. 5) in a respective sidewall 408 of the container 404. The container data center 400 includes electronic equipment racks (which are not shown in FIGS. 4-5 of the drawings, for clarity of illustration) to keep the modular server units 321 in upright interspaced columns, similar to that described with reference to FIGS. 1-3. The racks are arranged in two oppositely facing longitudinally extending rows (see FIG. 4A), so that the rear panels 237 of modular server units 321 in the respective rows face each other and are closely laterally spaced.

Because of the construction and design of the server unit 321, as described above, regular access to the rear panels 237 is not required, enabling arrangement of the modular server units 321 in ultradense configurations such as the example shown in FIG. 4A, in which there is, for example, no central aisle to provide user access to the rear panels 237 of the modular server units 321. The container data center 400 also does not have any air ducting, because no air-cooling of the electronic components is required, further promoting hyperdense equipment arrangement. A further benefit of the exclusively liquid-cooled data center 400 is that no humidity or contaminated air is allowed into the interior of the container 404, preventing exposure of electronic equipment in the modular server units 321 to such humidity or air contamination.

It is a benefit of the example modular, mobile data center 400 that the modular server units 321 as well as the container 404 have standard dimensions. This permits use of existing transportation equipment and data center equipment (e.g., server racks and associated attachments) to achieve increased server density, without necessitating modification of the existing equipment. Modular electronic equipment units of standardized dimensions can accordingly be housed in a container of standard dimensions in transversely extending pairs of modular server units 321 arranged end-to-end. The example modular server units 321 accordingly have a standard rack depth (d) of 43.38 inches, while the container 404 has a standard container width (W) of 8 feet. The example container 404 may further have a standard length, for example being 20 feet or 40 feet long.

Figure 5:
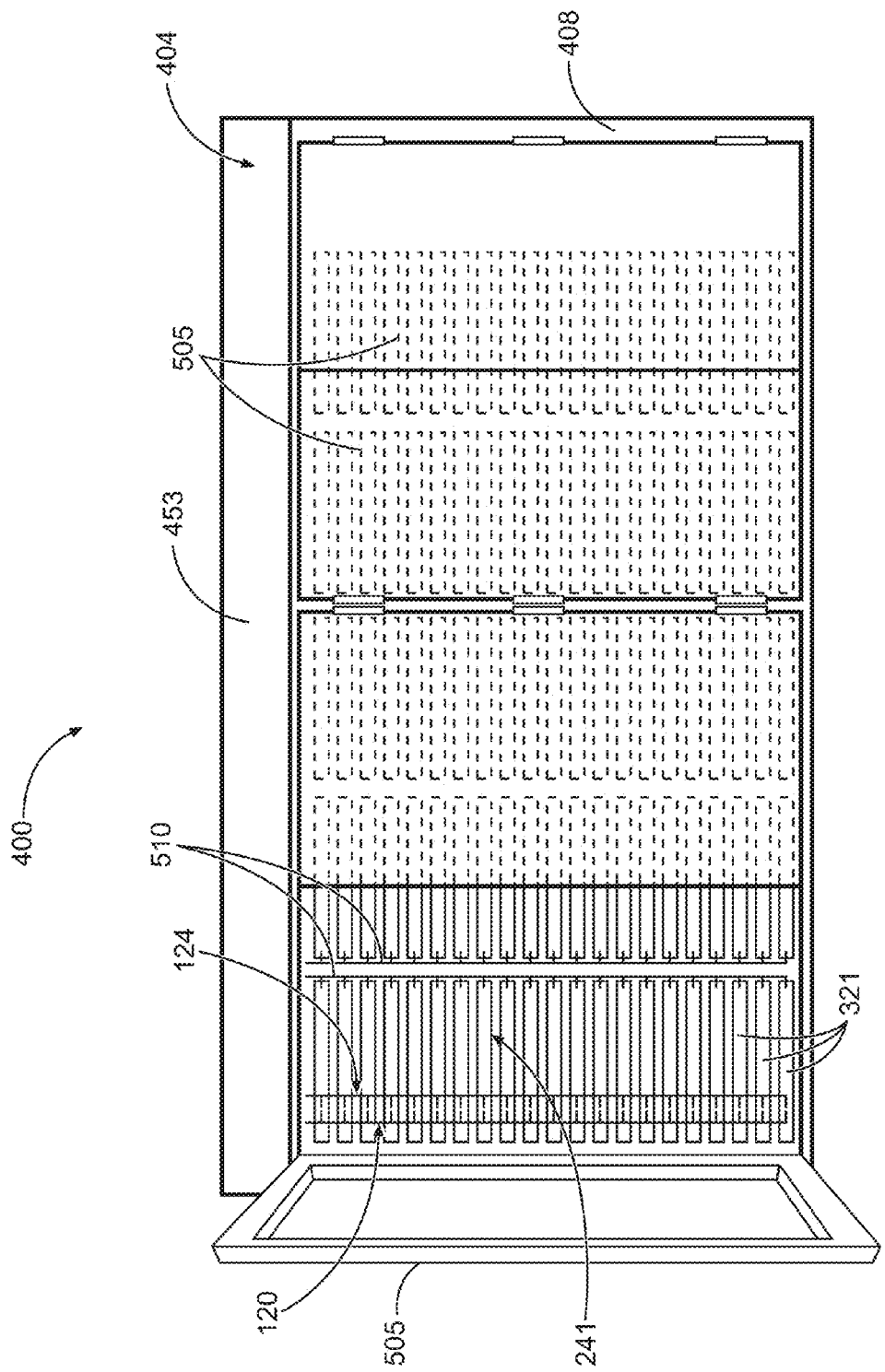
FIG. 5 is a schematic side view of a mobile modular data center facility in accordance with the example embodiment of FIG. 4A.

As mentioned, the transverse gap between the rows of modular server units 321, running along the length of the container 404, is too narrow to serve as a service way. Instrumentation and system interfaces provided on the front panels 241 of the modular server unit 321 are accessible through the side doors 505, with a transverse gap between the server front panels 241 and the sidewall 408/side doors 505 of the container 404 providing a narrow service way for system connections such as connections to power, cooling, and IT networks. Referring now to FIG. 5 (which shows a schematic side view of the example container data center 400), it can be seen that cooling connections of the modular server units 321 to a native liquid cooling system (in this example being by connection to the cooling system connectors 305 of respective tubes providing the facility coolant supply line 124 and the facility coolant return line 120) are laterally offset to one side of the front panels 241, while the connections to a power supply line 510, and to the modular server unit 321 in a particular rack, are located adjacent an opposite side of the modular server unit 321. Networking communications and instrumentation (such as, e.g., LED indicators and the like) may be provided on the remainder of the respective front panels 241.

The particular sides of the front panels 241 on which the cooling connections and the power connections are respectively provided may be alternated from one column of modular server units 321 to the next, along the length of the container 404. This arrangement conveniently results in adjacency of the same type of system connections at adjacent sides of server units 321 in adjacent columns. As can be seen in FIG. 5, the power supply line 510 of a hindmost column of modular server units 321 (i.e., the leftmost column in FIG. 5) is adjacent to the power supply line 510 of the next column in the lengthwise direction of the container 404. On the other side of the second column of modular server units 321, the cooling connections of the respective adjacent servers 122 will be closely collocated. IT gear is, in operation, installed from the side of the container 404, through the side doors 505, with the described arrangement of connector location promoting service efficiency.

Returning now to FIG. 4A, it is shown that the example container data center 400 includes a liquid economizer in the form of a liquid-to-liquid heat exchanger 412 situated in a top section of the container 404. The heat exchanger 412 uses ambient supply water 416 to cool liquid coolant returning via the facility coolant return line 120, and can be used to capture waste water for waste heat recovery (e.g., being employed for comfort heating of buildings).

Note that although the facility coolant supply line 124 and the facility coolant return line 120 are shown in FIGS. 4 and 5 to be connected directly to the respective modular server units 321, the facility coolant in this example embodiment (similar to the example embodiment described with reference to FIGS. 1-3) does not circulate directly through the modular server units 321, but is instead circulated to respective heat exchangers 205 of multiple fault domains 203 in each vertically extending column of modular server units 321. The facility coolant supply line 124 and the facility coolant return line 120 may thus, for example, be connected to integrated rack-level manifolds that house fault domain heat exchangers 205, makeup tanks 207, and associated equipment described with reference to the CDU extension 112 of FIG. 2. Each column of modular server units 321 may further be provided by fault domain leak pans 213 and a common drip pan 247 similar or analogous to that described in the FIG. 2 example. As mentioned, it is a benefit of the example modular server unit 321 that its seal, the casing 389, being watertight, provides a first level of fault containment, catching and semipermanently containing all internal leakage. With semipermanent containment is meant that the leaked coolant is not drained from the casing 389, but remains in the casing 389 until service personnel remove or service the affected server unit 321.

FIG. 4B shows a container data center 451 in accordance with a further example embodiment. The container data center 451 is analogous in operation and configuration to the container data center 400 of FIG. 4A, but has an air economizer in the example form of a dry cooler that employs radiators 461 to cool facility coolant by heat exchange with ambient air 457.

The cooling systems of the example container data center 400, 451 operate without any chillers or refrigerators, because no refrigeration is required to bring the temperature of the facility coolant into the usable range. Unlike existing container-housed IT facilities which use air-cooled equipment, the data centers 400, 451 can operate without any air conditioning.

Hardware Platform

Embodiments may be implemented in one or a combination of hardware, firmware, and software. As mentioned, the control system 151 (FIG. 1) may, for example, be provided by a hardware that is programmed to monitor multiple fault domains 203, and to prompt remedial action in the event of leak detection. Embodiments may also be implemented as instructions stored on a machine-readable storage device, which may be read and executed by at least one processor to perform the operations described herein. A machine-readable storage device may include any non-transitory mechanism for storing information in a form readable by a machine (e.g., a computer). For example, a machine-readable storage device may include read-only memory (ROM), random-access memory (RAM), magnetic disk storage media, optical storage media, flash-memory devices, and other storage devices and media.

Examples, as described herein, can include, or can operate on, logic or a number of components, modules, or mechanisms. Modules are tangible entities (e.g., hardware) capable of performing specified operations and can be configured or arranged in a certain manner. In an example, circuits can be arranged (e.g., internally or with respect to external entities such as other circuits) in a specified manner as a module. In an example, the whole or part of one or more computer systems (e.g., a standalone, client or server computer system) or one or more hardware processors can be configured by firmware or software (e.g., instructions, an application portion, or an application) as a module that operates to perform specified operations. In an example, the software can reside on a machine-readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor can be configured as respective different modules at different times. Software can accordingly configure a hardware processor, for example, to constitute a particular module at one instance of time and to constitute a different module at a different instance of time.

Figure 6:
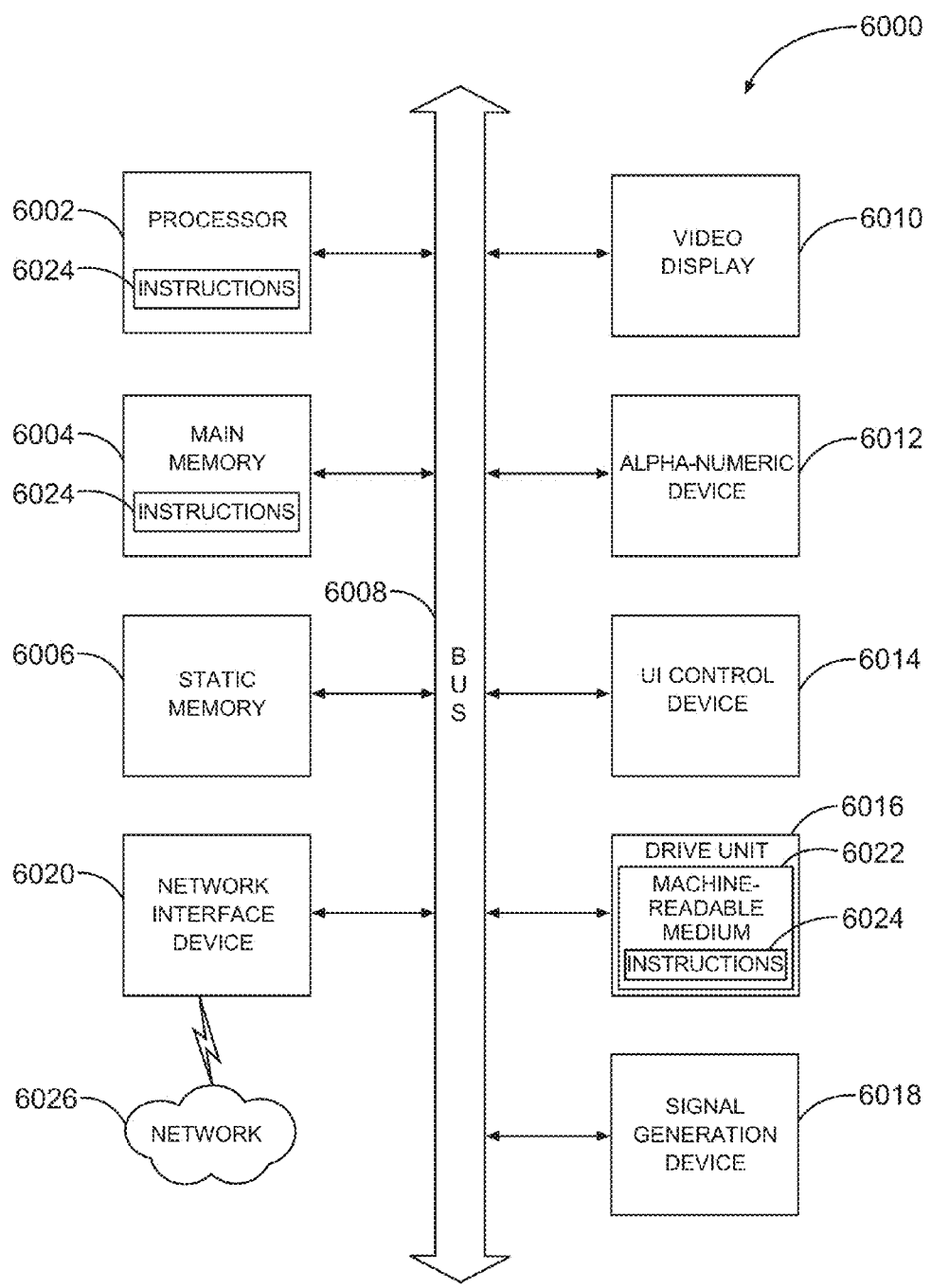
FIG. 6 is a block diagram illustrating a machine in the example form of a computer system within which a set or sequence of instructions may be executed to cause the machine to perform any one of the methodologies discussed herein, according to an example embodiment.

FIG. 6 is a block diagram illustrating a machine in the example form of a computer system 6000, within which a set or sequence of instructions 6024 may be executed to cause the machine to perform any one of the methodologies discussed herein, according to an example embodiment. In alternative embodiments, the machine operates as a standalone device or may be connected (e.g., networked) to other machines. In a networked deployment, the machine may operate in the capacity of either a server or a client machine in server-client network environments, or it may act as a peer machine in peer-to-peer (or distributed) network environments. The machine may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

Example computer system 6000 includes at least one processor 6002 (e.g., a central processing unit (CPU), a graphics processing unit (GPU) or both, processor cores, compute nodes, etc.), a main memory 6004 and a static memory 6006, which communicate with each other via a link 6008 (e.g., bus). The computer system 6000 may further include a video display unit 6010, an alphanumeric input device 6012 (e.g., a keyboard), and a user interface (UI) navigation device 6014 (e.g., a mouse). In one embodiment, the video display unit 6010, input device 6012 and UI navigation device 6014 are incorporated into a touch screen display. The computer system 6000 may additionally include a storage device 6016 (e.g., a drive unit), a signal generation device 6018 (e.g., a speaker), a network interface device 6020, and one or more sensors (not shown), such as a global positioning system (GPS) sensor, compass, accelerometer, or other sensor.

The storage device 6016 includes a machine-readable medium 6022 on which is stored one or more sets of data structures and instructions 6024 (e.g., software) embodying or utilized by any one or more of the methodologies or functions described herein. The instructions 6024 may also reside, completely or at least partially, within the main memory 6004, static memory 6006, and/or within the processor 6002 during execution thereof by the computer system 6000, with the main memory 6004, static memory 6006, and the processor 6002 also constituting machine-readable media.

While the machine-readable medium 6022 is illustrated in an example embodiment to be a single medium, the term "machine-readable medium" may include a single medium or multiple media (e.g., a centralized or distributed database, and/or associated caches and servers) that store the one or more instructions 6024. The term "machine-readable medium" shall also be taken to include any tangible medium that is capable of storing, encoding or carrying instructions for execution by the machine and that cause the machine to perform any one or more of the methodologies of the present disclosure or that is capable of storing, encoding or carrying data structures utilized by or associated with such instructions. The term "machine-readable medium" shall accordingly be taken to include, but not be limited to, solid-state memories, and optical and magnetic media. Specific examples of machine-readable media include non-volatile memory, including, by way of example, semiconductor memory devices (e.g., electrically programmable read-only memory (EPROM), electrically erasable programmable read-only memory (EEPROM)) and flash memory devices; magnetic disks such as internal hard disks and removable disks; magneto-optical disks; and CD-ROM and DVD-ROM disks.

The instructions 6024 may further be transmitted or received over a communications network 6026 using a transmission medium via the network interface device 6020 utilizing any one of a number of well-known transfer protocols (e.g., HTTP). Examples of communication networks include a local area network (LAN), a wide area network (WAN), the Internet, mobile telephone networks, plain old telephone (POTS) networks, and wireless data networks (e.g., Wi-Fi, 3G, and 4G LTE/LTE-A or WiMAX networks). The term "transmission medium" shall be taken to include any intangible medium that is capable of storing, encoding, or carrying instructions for execution by the machine, and includes digital or analog communications signals or other intangible medium to facilitate communication of such software.

Although embodiments have been described with reference to specific example embodiments, it will be evident that various modifications and changes may be made to these embodiments without departing from the broader spirit and scope of the disclosure. Accordingly, the specification and drawings are to be regarded in an illustrative rather than a restrictive sense.

The Abstract is provided to allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An assembly comprising:
a plurality of heat exchangers configured to transfer heat to a heat disposal medium from liquid coolant passed in heat exchange relationship through a set of rack-mounted modular electronic equipment units, each of the plurality of heat exchangers configured for liquid-flow connection in a respective equipment-side coolant circuit that passes liquid coolant through a respective, exclusive subset of the electronic equipment units, the equipment-side coolant circuits of the respective heat exchangers being in liquid-flow segregation from one another; and
a plurality of coolant reservoirs, each in liquid-flow communication exclusively with a corresponding one of the plurality of heat exchangers to deliver supplemental liquid coolant to the corresponding equipment-side coolant circuit responsive to coolant loss therefrom.

2. The assembly of claim 1, wherein each coolant reservoir is a sole source of supplemental liquid coolant to the corresponding equipment-side coolant circuit, so that each equipment-side coolant circuit and its associated coolant reservoir define a closed volume.

3. The assembly of claim 1, further comprising a sensor arrangement coupled to the plurality of coolant reservoirs and configured to provide separate coolant volume measurements for the respective coolant reservoirs, each coolant volume measurement indicating at least one of: a volume of liquid coolant in the corresponding coolant reservoir, and a rate of change of liquid coolant volume in the corresponding coolant reservoir.

4. The assembly of claim 3, wherein the sensor arrangement comprises a plurality of level sensors, each of which is coupled to the corresponding one of the plurality of coolant reservoirs to sense a liquid coolant level in the corresponding coolant reservoir.

5. The assembly of claim 1, further comprising a rack extension body configured for retrofit connection to an equipment rack on which the electronic equipment units are mounted, the plurality of heat exchangers and the plurality of coolant reservoirs being mounted on the rack extension.

6. The assembly of claim 5, wherein the rack extension body includes an integral manifold arrangement configured to provide at least part of a liquid-flow connection between the plurality of heat exchangers and the modular electronic equipment units, the manifold arrangement comprising a plurality of separate manifold connections, each of which is exclusively coupled to a corresponding one of the plurality of heat exchangers.

7. The assembly of claim 1, further comprising:
an equipment support frame configured to hold the set of modular electronic equipment units in one or more upright, interspaced columns; and
a plurality of leakage catchment containers mounted on the frame and vertically spaced such that a respective subgroup of the modular electronic equipment units in each column is located between each pair of adjacent leakage catchment containers, each leakage catchment container substantially spanning a horizontal width and an orthogonal horizontal depth of the corresponding column to catch and contain any liquid coolant leaked from any of the electronic equipment units in a superadjacent subgroup.

8. The assembly of claim 7, wherein each subgroup of electronic equipment units corresponds to one of the subsets of electronic equipment units, so that the assembly includes a plurality of nonoverlapping fault domains, each of which has a respective dedicated heat exchanger, a respective dedicated coolant reservoir, and a respective dedicated leakage catchment container.

9. The assembly of claim 7, further comprising a universal leak sump coupled to the equipment support frame, each of the leakage catchment containers configured to drain to the universal leak sump.

10. The assembly of claim 1, further comprising:
an equipment support frame; and
the set of modular electronic equipment units supported on the equipment support frame, each of the modular electronic equipment units comprising a casing having a liquid-sealed base that provides a primary leak container to catch and hold any coolant leaked into an interior of the casing.

11. The assembly of claim 10, wherein each modular electronic equipment unit comprises a drainage mechanism configured to drain leaked coolant from the primary leak container in the interior of the casing to a secondary leak container.

12. The assembly of claim 10, wherein the casings of the modular electronic equipment units are respectively substantially watertight, the casing configured to semi-permanently contain and isolate any coolant leaked into the interior of the casing.

13. A system comprising:
an equipment rack;
a set of electronic equipment units mounted on the equipment rack and configured for liquid cooling by passing a liquid coolant through interiors of respective electronic equipment units;
a plurality of heat exchangers configured to transfer heat to a heat disposal medium from the coolant liquid, each heat exchanger being connected exclusively to a respective subset of the electronic equipment units via a corresponding equipment-side coolant circuit, the equipment side cooling circuits of the respective heat exchangers being in liquid flow segregation from one another; and
a plurality of coolant reservoirs, each in fluid flow communication with a respective one of the equipment-side coolant circuits, each coolant reservoir holding a volume of liquid coolant and being configured to supplement liquid coolant in the corresponding equipment-side coolant circuit responsive to liquid coolant loss therefrom.

14. The system of claim 13, further comprising a control system configured to:
monitor the volume of liquid coolant in the respective coolant reservoirs; and
generate an alarm signal responsive to a rate of change in the volume of liquid coolant in a particular one of the coolant reservoirs being above a predefined threshold value.

15. The system of claim 14, wherein the control system is further configured to communicate identification of the respective subset of electronic equipment units corresponding to the particular coolant reservoir as potentially including a liquid coolant leak.

16. The system of claim 13, further comprising a plurality of leakage catchment containers mounted on the equipment rack and vertically spaced such that a respective one of the subsets of electronic equipment units is located between each pair of adjacent leakage catchment containers, each leakage catchment container substantially spanning a horizontal width and an orthogonal horizontal depth of the equipment rack, to catch and contain liquid coolant leakage from any of the electronic equipment units in a superadjacent subset.

17. A method comprising:
  holding a plurality of electronic equipment units on an equipment rack;
  cooling the plurality of electronic equipment units by use of a liquid cooling system that comprises a plurality of segregated fault domains, each fault domain comprising:
    a respective subset of the plurality of electronic equipment units, and
    a respective cooling circuit configured to circulate liquid coolant through interiors of the respective electronic equipment units in the corresponding fault domain, each cooling circuit having no external source of liquid coolant, with the cooling circuits of the respective fault domains being in liquid-flow segregation from one another; and
  monitoring liquid coolant levels in the respective cooling circuits to identify a potential liquid coolant leak in a particular fault domain in response to detecting a rate of change in liquid coolant level that exceeds a predefined threshold value.

18. The method of claim 17, or wherein each cooling circuit comprises:
  a dedicated heat exchanger that exchanges heat between the coolant liquid and a heat disposal medium; and
  a dedicated coolant reservoir to supplement liquid coolant in coolant conduits that circulate coolant liquid between the heat exchanger and the electronic equipment units of the respective fault domain.

19. The method of claim 17, further comprising identifying a failure mode of the potential liquid coolant leak based at least in part on the detected rate of change in liquid coolant level of the particular fault domain.

20. The method of claim 19, further comprising severing a power supply to a particular subset of the plurality of electronic equipment units which corresponds to the particular fault domain in response to identifying the failure mode as being a fast leak.

* * * * *